United States Patent
Ekler

(10) Patent No.: US 11,782,095 B2
(45) Date of Patent: Oct. 10, 2023

(54) PROCESSING SYSTEM FOR MONITORING THE CELL VOLTAGES OF A RECHARGEABLE BATTERY, RELATED BATTERY MONITORING SYSTEM AND ELECTRIC VEHICLE

(71) Applicant: STMicroelectronics Application GMBH, Aschheim-Dornach (DE)

(72) Inventor: Markus Ekler, Munich (DE)

(73) Assignee: STMicroelectronics Application GMBH, Aschheim-Dornach (DE)

( * ) Notice: Subject to any disclaimer, the term of this patent is extended or adjusted under 35 U.S.C. 154(b) by 276 days.

(21) Appl. No.: 17/368,198

(22) Filed: Jul. 6, 2021

(65) Prior Publication Data
US 2022/0018907 A1    Jan. 20, 2022

(30) Foreign Application Priority Data

Jul. 20, 2020   (IT) ......................... 102020000017581

(51) Int. Cl.
| | |
|---|---|
| *G01R 31/382* | (2019.01) |
| *G01R 31/396* | (2019.01) |
| *G01R 31/367* | (2019.01) |
| *B60L 58/12* | (2019.01) |
| *H01M 10/42* | (2006.01) |

(52) U.S. Cl.
CPC ............ *G01R 31/382* (2019.01); *B60L 58/12* (2019.02); *G01R 31/367* (2019.01); *G01R 31/396* (2019.01); *H01M 10/4257* (2013.01); *H01M 2010/4271* (2013.01); *H01M 2220/20* (2013.01)

(58) Field of Classification Search
CPC ..... B60L 3/12; B60L 58/12; G01R 19/16542; G01R 31/367; G01R 31/382; G01R 31/396; H01M 10/4257; H01M 10/482; H01M 2010/4271; H01M 2010/4278; H01M 2220/20; H02J 2310/48; H02J 7/00032; H02J 7/0013; H02J 7/0047; H03M 7/3059; Y02E 60/10; Y02T 10/70; Y02T 90/16
See application file for complete search history.

(56) References Cited

U.S. PATENT DOCUMENTS

| | | |
|---|---|---|
| 9,312,874 B1 | 4/2016 | Kakolaki et al. |
| 2018/0183460 A1 | 6/2018 | Lee et al. |

*Primary Examiner* — Victoria H Lynch
(74) *Attorney, Agent, or Firm* — Slater Matsil, LLP

(57) ABSTRACT

An embodiment processing system comprises terminals configured to be connected to cells of a rechargeable battery to receive cell voltages, a digital processing circuit, a serial communication interface and a transmission queue interfacing the digital processing circuit with the serial communication interface for parallel operation. The digital processing circuit synchronously acquires a given number of digital samples of each of the cell voltages and stores them to a memory. The digital processing circuit encodes the digital samples stored to the memory via a data compression module, and stores the encoded data to the transmission queue. For example, the data compression module may generate the encoded data by subtracting a given offset from each digital sample to generate values indicative of the dynamic variation of each sample with respect to the offset, and removing a given number of most significant bits from each value.

23 Claims, 9 Drawing Sheets

| $S_{n,1}$ | $D_{n,1}$ | ... | $D_{n,k-1}$ |
|---|---|---|---|
| ⋮ | | | ⋮ |
| $S_{1,1}$ | $D_{1,1}$ | ... | $D_{1,k-1}$ |

PROCESSING SYSTEM FOR MONITORING THE CELL VOLTAGES OF A RECHARGEABLE BATTERY, RELATED BATTERY MONITORING SYSTEM AND ELECTRIC VEHICLE

CROSS-REFERENCE TO RELATED APPLICATIONS

This application claims the benefit of Italian Application No. 102020000017581, filed on Jul. 20, 2020, which application is hereby incorporated herein by reference.

TECHNICAL FIELD

Embodiments of the present description refer to a monitoring and/or management system for a high voltage rechargeable battery comprising a plurality of cells, such as lithium-ion cells.

BACKGROUND

FIG. 1 shows a typical electronic system, such as the electronic system of a vehicle, comprising a plurality of processing systems 10, such as embedded systems or integrated circuits, e.g., a Field Programmable Gate Array (FPGA), Digital Signal Processor (DSP) or a micro-controller (e.g., dedicated to the automotive market).

For example, in FIG. 1 are shown three processing systems 101, 102 and 103 connected through a suitable communication system 20.

For example, in case of a vehicle, the communication system 20 may include a vehicle control bus, such as a Controller Area Network (CAN) bus, and possibly a multimedia bus, such as a Media Oriented Systems Transport (MOST) bus, connected to vehicle control bus via a gateway. Typically, the processing systems 10 are located at different positions of the vehicle and may include, e.g., an Engine Control Unit (ECU), a Transmission Control Unit (TCU), an Anti-lock Braking System (ABS), a body control module (BCM), and/or a navigation and/or multimedia audio system.

In case of electric vehicles, including full-electric, plug-in hybrid and non-plug-in hybrid vehicles, such as electric cars, trucks, motor-cycles, bikes, scooters, etc., the vehicle comprises also a rechargeable battery 30 and a processing system 10 implementing a battery management system 40.

For example, FIG. 2 shows an example of a battery management system 40 configured to monitor a rechargeable battery 30, such as a lithium-ion (Li-Ion) battery. As mentioned before, such a battery management system 40 may be used in an electric vehicle. However, the battery management system 40 may also be used in other energy storage applications, such as for home-energy storage.

Specifically, in the example considered, the rechargeable battery 30 comprises a plurality of cells C connected in series. For example, such cells C are usually organized in sets of cells, e.g., in the form of battery modules, wherein each set of cells comprises usually the same number n of cells. For example, in FIG. 2, the cells are organized in m sets, wherein each set comprises n cells, i.e., the battery 30 comprises a first set of cells $C_{1,1}, \ldots C_{1,n}$, a last set of cells $C_{m,1}, \ldots C_{m,n}$ and optionally one or more intermediate sets of cells, wherein the sets of cells $C_{1,1}, \ldots C_{1,n}$, to $C_{m,1}, \ldots C_{m,n}$ are connected in series.

Usually, such a battery management system 40 comprises two terminals 400 and 402 for connection to the battery 30, in particular the first cell $C_{1,1}$ and the last cell $C_{m,n}$, and two terminals 404 and 406 for connection to a load and charge circuit. Usually, the load and charge circuit comprises a switching circuit, e.g., in the form of an electric (usually an electronic) converter/inverter configured to receive energy from at least one power source and provide energy to an electric load. For example, in an electric vehicle, the terminals 404 and 406 may be connected via a power controller to an electric traction motor of the vehicle. Conversely, in home-energy storage applications, the terminals 404 and 406 may be connected to an inverter configured to:

receive energy from the mains/power grid or a local electric energy generator, such as one or more photovoltaic panels, and provide energy to a load in the home environment or also to the grid.

In FIG. 2, the battery management system 40 comprises a digital processing system 42 configured to monitor and/or control one or more parameters of the battery 30.

For example, FIG. 3 shows a block diagram of an exemplary digital processing system 42, such as a micro-controller. In the example considered, the processing system 42 comprises at least one digital processing circuit 422, such as a microprocessor, usually the Central Processing Unit (CPU), programmed via software instructions. Usually, the software executed by the processing unit 422 is stored in a program memory 424, such as a non-volatile memory, such as a flash memory or electrically-erasable programmable read-only memory (EEPROM). Generally, the memory 424 may be integrated with the processing unit 422 in a single integrated circuit, or the memory 424 may be in the form of a separate integrated circuit and connected to the processing unit 422, e.g., via the traces of a printed circuit board. Thus, in general the memory 424 contains the firmware for the processing unit 422, wherein the term firmware includes both the software of a micro-processor and the programming data of a programmable logic circuit, such as a FPGA.

In the example considered, the processing unit 422 may have associated one or more resources 426, such as:

one or more communication interfaces, such as Universal asynchronous receiver/transmitter (UART), Serial Peripheral Interface Bus (SPI), Inter-Integrated Circuit (I2C), Controller Area Network (CAN) bus, Ethernet, and/or debug interfaces; and/or one or more analog-to-digital and/or digital-to-analog converters; and/or one or more dedicated digital components, such as hardware timers and/or counters, or a cryptographic co-processor; and/or one or more analog components, such as comparators, sensors, such as a temperature sensor, etc.; and/or one or more mixed signal components, such as a PWM (Pulse-Width Modulation) driver.

For example, by using the resources 426 and via a suitable programming of the digital processing circuit 422, the battery management system 40 may be configured to manage one or more of the following functions:

data exchange with other processing systems 10 of the electronic system, e.g., via the communication channel 20;

a driving of one or more electric or electronic switches 410 and 412 in order to selectively connect the battery 30 to the terminals 404 and 406, e.g., based on the vehicle state (drive, park, charge, etc.);

a driving and/or monitoring of a pyro-fuse 414, which e.g., provides an emergency cut-off of the battery 30 in case of accidents, isolation breach or other faults; and a monitoring of the current flowing through the battery 30, e.g., via a current sensor 418, such as a shunt resistor or a hall sensor, and optionally a current sensor circuit 416, which already performs a pre-processing of the signal provided by the current sensor 418, e.g., in order to determine whether the measured current exceeds a given threshold.

Moreover, in case of rechargeable batteries 30 comprising a plurality of cells, such as high-voltage Li-Ion batteries, the battery management system 40 is often configured to:

monitor the voltages at the individual cells C of the battery 30; and optionally monitor the temperature of the individual cells C or sets of cells of the battery 30; and optionally balance the charge level of the individual cells C of the battery.

For example, as shown in FIG. 2, often these battery management functions are not implemented directly in the digital processing circuit/system 42, but in additional processing circuits/systems $44_1 \ldots 44_m$, wherein each processing system 44 performs the above operations for a respective set of cells, e.g., the processing system $44_1$ manages the cells $C_{1,1} \ldots C_{1,n}$ and the processing system $44_m$ manages the cells $C_{m,1} \ldots C_{m,n}$.

In the example considered, the additional processing systems 44, such as integrated circuits, are then connected to the digital processing system 42 via a suitable communication channel 48. For example, the digital processing system 42 may be configured to receive the measured cell voltages from the various processing circuit 44.

For example, FIG. 4 shows a known solution. In the example considered, the processing system 44, e.g., an integrated circuit L9963 from STMicroelectronics, is configured to be connected to a given number n of cells C, e.g., up to 14 cells C, and generate digital samples of the respective cell voltages.

For example, as shown in FIG. 5, for this purpose, the processing system 44 may comprise a given number n+1 of pins $CP_o \ldots CP_n$, wherein each pin CP is configured to be connected to a respective terminal of the cells, e.g., the pin $CP_o$ may be connected to the negative terminal of a first cell $C_1$, the pin $CP_1$ may be connected to the positive terminal of a first cell $C_1$ corresponding to the negative terminal of a second cell $C_2$, etc. Thus, the voltage between two pins CP corresponds to the voltage at a given cell C. Generally, also an analog filter, such as RC low-pass filter, may be connected in parallel with each cell, wherein the pins $CP_o \ldots CP_n$ receive filtered versions of the cell voltages.

In the example considered, the voltages are provided to one or more differential analog-to-digital converters (ADC) 448, such as delta-sigma converters. For this purpose, the processing system 44 may also comprise a switching circuit 446, e.g., comprising one or more multiplexers, configured to connect a given pair of pins CP to a given analog-to-digital converter 448. Generally, the switching circuit 446 is purely optional, because the processing system 44 may also comprise n analog-to-digital converters, i.e., one ADC for each cell C of the respective set of cells. In the example considered, the digital samples are provided to a digital processing circuit 444 of the processing system 44. Generally, the digital processing circuit 444 may be any hardware and/or software digital processing circuit, such as an integrated finite state machine (e.g., implemented with a hardware sequential logic circuit) or a microprocessor programmed via software instructions.

The processing system 44, e.g., the digital processing circuit 444, is also configured to transmits the digital samples to the digital processing system 42, such as a micro-controller. For this purpose, the processing system 44 comprises a communication interface 440. For example, in case of a L9963 circuit, the communication interface 440 supports two modes of communication: a Serial Peripheral Interface (SPI) or an isolated communication via a capacitive or inductive coupling. However, in general, also other communication protocols may be used, such as I2C, UART or CAN bus.

Moreover, e.g., in case of a L9963 circuit, a plurality of processing circuit 44 may be connected in series in order to form a daisy chain. Specifically, for this purpose, each processing system 44 may comprise a further communication interface 442 configured to be connected to the communication interface 440 of a following/downstream processing circuit 44. Accordingly, in this case, the digital processing circuit 444 may also manage the data exchange between the interfaces 440 and 442 of the respective processing circuit 44.

Accordingly, the digital processing system 42 may comprise a communication interface 426 configured to be connected to the communication channel 48:

e.g., when using the isolated communication with daisy chain, to the interface 440 of the first processing circuit 441; or e.g., when using the SPI communication, to each interface 440 of the various processing circuits 44.

Generally, in case the interface 426 is not compatible with the interface 440, a bridge circuit 46 may be used to interface the interface 426 with the interface 440. For example, such a bridge circuit 46 may comprise a first interface 460, such as a SPI interface, for connection to the interface 426 and a second interface 462 for connection to the interface(s) 440. For example, the bridge circuit 46 may be an integrated circuit L9963T from STMicroelectronics.

Thus, in FIG. 4 (and similarly in FIG. 2), the processing systems 44 are configured to acquire via analog-to-digital converters 448 the voltages at the cells C of the battery (or filtered versions thereof), and transmit (e.g., via other processing systems 44 and/or the bridge circuit 46) the digital samples of the cell voltages to the digital processing system 42. For example, when each set of cells comprises the same number n of cells C, up to n×m samples have to be acquired and transmitted. For example, a typical vehicle battery 30 may have a voltage in the range of 200 V to 1000 V, typically between 400 V and 800 V. In this respect, a typical Li-Ion cell has a voltage around 3.7 V. For example, this implies that at least 108 cells C have to be connected in series in order to obtain a voltage of 400 V. Accordingly, in this case, eight STM L9963 would be required to monitor the respective cells C. Evidently, in case of 800 V systems, the numbers have to be doubled. Thus, in typical applications between 50 and 250 cell voltages have to be acquired. For example, the cell voltages may be sampled with ADCs 448 having 16 bit.

Preferably, the number of ADCs 448 in the processing systems 44 corresponds to (or is greater than) the number n in order to permit that the cell voltages at the cells (at least of the same set of cells and preferably of all cells of the battery 30) may be sampled at the same instant. For example, for this purpose, the digital processing system 42 may send a synchronization trigger signal, or some kind of other synchronization signal, e.g., comprising a sampling period, to the processing systems 44.

Moreover, as mentioned before, the processing systems 44 may also implement other operations, such as a temperature monitoring of the respective battery module or cells, and/or a balancing function. For this purpose, further data may be exchanged between the digital processing system 42 and the processing systems 44.

However, due to the use of a serial communication channel 48, e.g., in the form of a daisy chain, preferably a galvanically-isolated communication channel, data transfer has a limited bandwidth. For example, this implies that, especially in case of high voltage batteries comprising at least 50 cells C connected in series, the sampling period is slow.

SUMMARY

Considering the foregoing, various embodiments provide a more efficient communication of the voltages of the cells of a rechargeable battery, such as a high voltage Li-Ion vehicle battery.

According to one or more embodiments, one or more of the above objects are achieved by a processing system for monitoring the cell voltages of a rechargeable battery having the distinctive elements set forth specifically in the ensuing claims. Embodiments moreover concern a related battery monitoring system and electric vehicle.

The claims form an integral part of the technical teaching of the description provided herein.

As mentioned before, various embodiments of the present disclosure relate to a processing system, e.g., implemented in an integrated circuit, configured to monitor the cell voltages of a given number of cells of a rechargeable battery. For example, such processing systems may be used in a battery monitoring and optionally management system comprising terminals configured to be connected to a rechargeable battery, and a further processing system, such as a micro-processor, configured to receive the cell voltages from the processing systems. For example, such a battery monitoring system may be used to monitor a rechargeable (traction) battery of an electric vehicle.

In various embodiments, the processing system comprises terminals configured to be connected to the cells in order to receive the cell voltages, and at least one analog to digital converter configured to generate digital samples of the cell voltages, wherein each digital sample has a given number of bits.

In various embodiments, the processing system comprises also a digital processing circuit, a serial communication interface and a transmission queue used to interface the serial communication interface with the digital processing circuit. Specifically, in various embodiments, the serial communication interface is configured to sequentially transmit the data stored to the transmission queue, whereby the digital processing circuit and the serial communication interface may operate in parallel.

Specifically, in various embodiments, the digital processing circuit comprises a (e.g., volatile) memory and a data compression module (such as a software module and/or a dedicated hardware circuit) and the digital processing circuit is configured to synchronously acquire a given number of digital samples of each of the given number of cell voltages and store the acquired digital samples to a memory. Next the digital processing circuit encodes the given number of digital samples of the given number of cell voltages stored to the memory via the data compression module, thereby generating encoded data, and stores the encoded data to the transmission queue. Accordingly, in various embodiments, the serial communication interface is configured to transmit the (encoded) data stored to the transmission queue, while the digital processing circuit acquires new digital sample.

Generally, the data compression module may be configured to implement various lossy or lossless data compression operations.

For example, in various embodiments, the data compression module is configured to generate the encoded data by means of a dynamic range reduction operation. In various embodiments, during the dynamic range reduction operation, the data compression module is configured to subtract a given offset from each of the digital samples, thereby generating values indicative of the dynamic variation of each sample with respect to the offset. Next, the data compression module generated the encoded data by removing a given number of most significant bits from each of the values indicative of the dynamic variation of each sample with respect to the given offset. Accordingly, in this case, the further processing system may reconstruct the original samples by adding the given offset to the received values. In various embodiments, the given offset is programmable, e.g., the digital processing circuit may be configured to receive the given offset via the serial communication interface, e.g., from the further processing system.

In various embodiments, also the given number of most significant bits may be programmable, e.g., the digital processing circuit may be configured to receive the given number of most significant bits via the serial communication interface, e.g., from the further processing system.

In various embodiments, during the dynamic range reduction operation, the data compression module is also configured to generate the encoded data by removing a given number of least significant bits from each of the values indicative of the dynamic variation of each sample with respect to the offset. Also the given number of least significant bits may be programmable, e.g., the digital processing circuit may be configured to receive the given number of least significant bits via the serial communication interface, e.g., from the further processing system.

Thus, in various embodiments, the value range of the samples is reduced. The inventor has observed that this implies that the value of a sample could also be outside of the value range, e.g., in case of malfunctions. For this reason, in various embodiments, the data compression module is configured to determine whether each of the given number of digital samples of the given number of cell voltages is between a minimum and a maximum threshold. In case one or more of the digital samples is not between the minimum and the maximum threshold, the data compression module may store the (original) value of the one or more digital samples not being between the minimum and the maximum threshold, and store data to the encoded data identifying that one or more of the digital samples are not between the minimum and the maximum threshold. For example, the data compression module may write default values to the encoded data or set a flag in the data packet transmitted to the further processing system.

Accordingly, based on these data, the further processing system may determine that the encoded data are not valid and send a re-transmission request to the processing system. Accordingly, the digital processing circuit/data compression module may be configured to receive this re-transmission request and, in response to the re-transmission request, transmit via the serial communication interface at least one of the values of the one or more digital samples not being between the minimum and the maximum threshold, e.g., by storing the (original) stored value to the transmission queue.

Additionally or alternatively, the data compression module may support other data compression modes. For example, in various embodiments, the data compression module is configured to support a plurality of encoding modes, wherein the data compression module is configured to generate the encoded data as a function of a selected encoding mode, wherein the selected encoding mode is programmable. For example, the digital processing circuit may be configured to receive the selected encoding mode via the serial communication interface, e.g., from the further processing system.

For example, in various embodiments, the encoding modes may comprise, in addition or as alternative to the dynamic range reduction, at least one of:
- a delta encoding mode, wherein the data compression module is configured to generate delta encoded values of the digital samples with respect to one or more reference values; and
- a 2D Discrete Fourier Transform mode, wherein the data compression module is configured to apply a 2D Discrete Fourier Transform mode to the given number of digital samples of the given number of cell voltages.

For example, the data compression module may be configured to generate the delta encoded values of a given cell voltage by:
- selecting the first of the given number of digital samples of the given cell voltage as a reference value, and generating the delta encoded values by calculating the difference between each following digital samples of the given cell voltage with respect to the reference value; or
- selecting the first of the given number of digital samples of the given cell voltage as a reference value, and generating the delta encoded values by calculating the difference between the following digital samples of the given cell voltage with respect to a previous digital sample of the given cell voltage; or
- determining values of a reference curve as a function of the digital samples, and generating the delta encoded values by calculating the difference between each digital sample of the given cell voltage with respect to the values of the reference curve.

In various embodiments, the data compression module may also support a plurality of these delta encoding modes, and the delta encoding modes may be selected by programming the selected encoding mode.

Moreover, in various embodiments, the data compression module may be configured to receive data identifying a value format and generate the delta encoded values as a function of the data identifying the value format by encoding the delta encoded values with a linear value encoding, or encoding the delta encoded values with a mantissa and an exponent.

Thus, in various embodiments, the processing system/ data compression module supports a plurality of encoding modes and/or formats, and the further processing system may program the selected encoding mode and/or format, via the serial communication interface. For example, in this way, the further processing system may be configured to determine whether the rechargeable battery is in a charge or discharge state and select a first encoding mode and/or format when the rechargeable battery is in the charge state and a second encoding mode and/or format when the rechargeable battery is in the discharge state (which usually implies a higher variability of the cell voltages).

In various embodiments, the processing system may also be configured to form a daisy chain with other processing systems. In this case, the processing system may comprise a further transmission queue, a further serial communication interface configured to sequentially receive data (from another processing system) and stored the received data to the further transmission queue. Accordingly, in this case, a multiplexer/arbiter may be configured to connect the serial communication interface to the transmission queue or the further transmission queue, whereby the serial communication interface is configured to sequentially transmit the data stored to the transmission queue or the further transmission queue.

BRIEF DESCRIPTION OF THE DRAWINGS

The embodiments of the present disclosure will now be described with reference to the annexed plates of drawings, which are provided purely to way of non-limiting example and in which.

The features and advantages of the present invention will become apparent from the following detailed description of practical embodiments thereof, shown by way of non-limiting example in the accompanying drawings, in which.

DETAILED DESCRIPTION OF ILLUSTRATIVE EMBODIMENTS

In the ensuing description, various specific details are illustrated aimed at enabling an in-depth understanding of the embodiments. The embodiments may be provided without one or more of the specific details, or with other methods, components, materials, etc. In other cases, known structures, materials, or operations are not shown or described in detail so that various aspects of the embodiments will not be obscured.

Reference to "an embodiment" or "one embodiment" in the framework of this description is meant to indicate that a particular configuration, structure, or characteristic described in relation to the embodiment is comprised in at least one embodiment. Hence, phrases such as "in an embodiment", "in one embodiment", or the like that may be present in various points of this description do not necessarily refer to one and the same embodiment. Moreover, particular conformations, structures, or characteristics may be combined in any adequate way in one or more embodiments.

The references used herein are only provided for convenience and hence do not define the sphere of protection or the scope of the embodiments.

In FIGS. 6 to 15 described below, parts, elements or components that have already been described with reference to FIGS. 1 to 5 are designated by the same references used previously in these figures. The description of these elements has already been made and will not be repeated in what follows in order not to burden the present detailed description.

As mentioned before, various embodiments of the present disclosure relate to solution for communicating the voltages of the cells of a rechargeable battery, such as a high voltage Li-Ion battery, such as the traction battery of an electric vehicle. In this respect, reference can be made to the previous description of a battery managements system.

Figure 1:
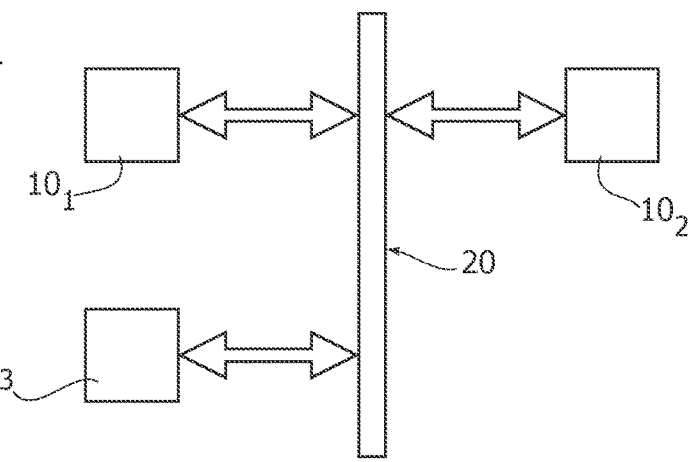
FIG. 1 shows an example of an electronic system.
Figure 2:
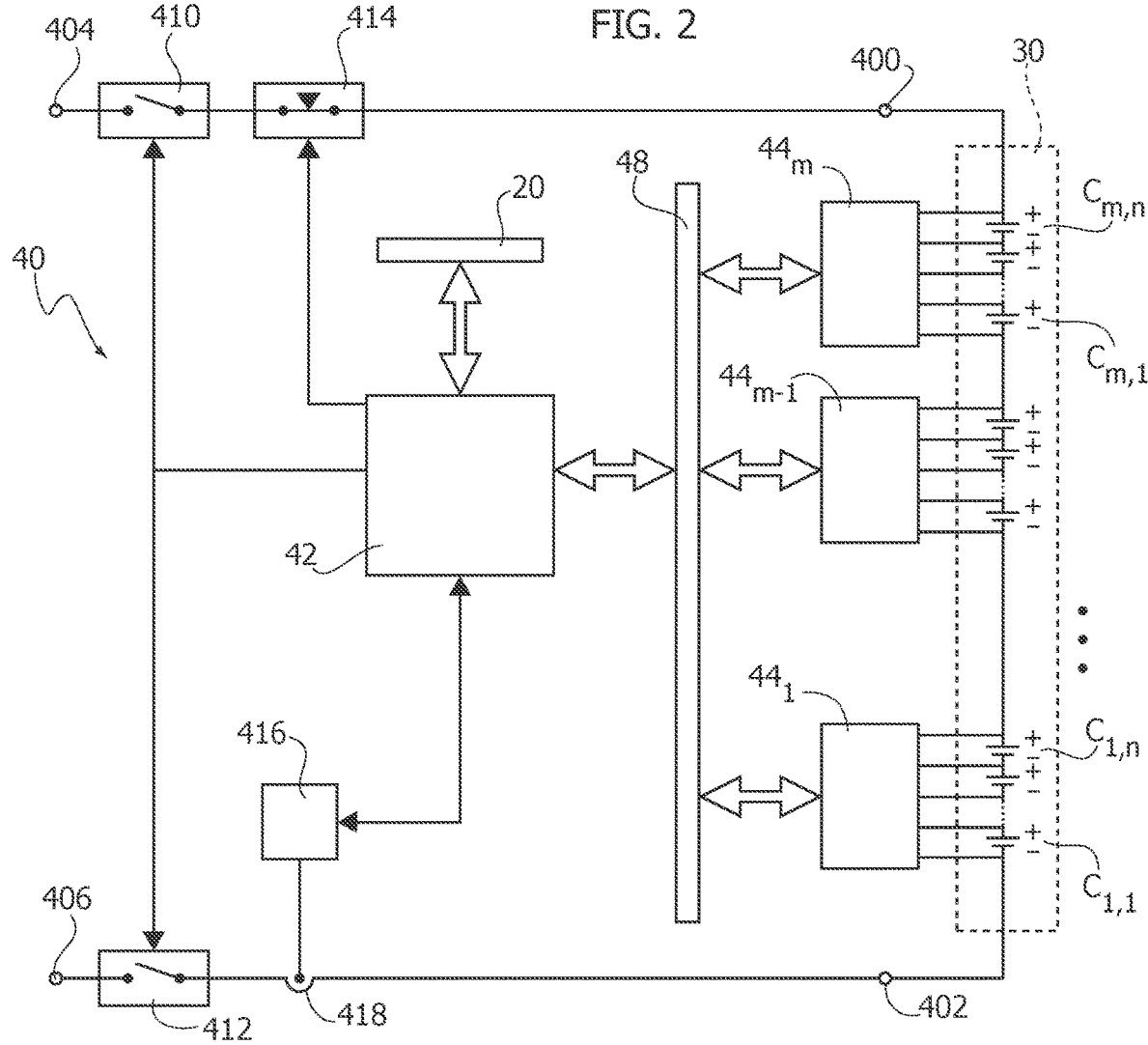
FIG. 2 shows an example of a battery management system for a rechargeable battery.
Figure 3:
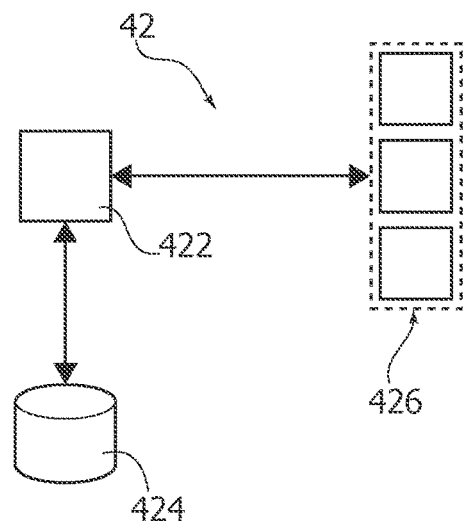
FIG. 3 shows an example of a digital processing system adapted to be used in the battery management system of FIG. 2.
Figure 4:
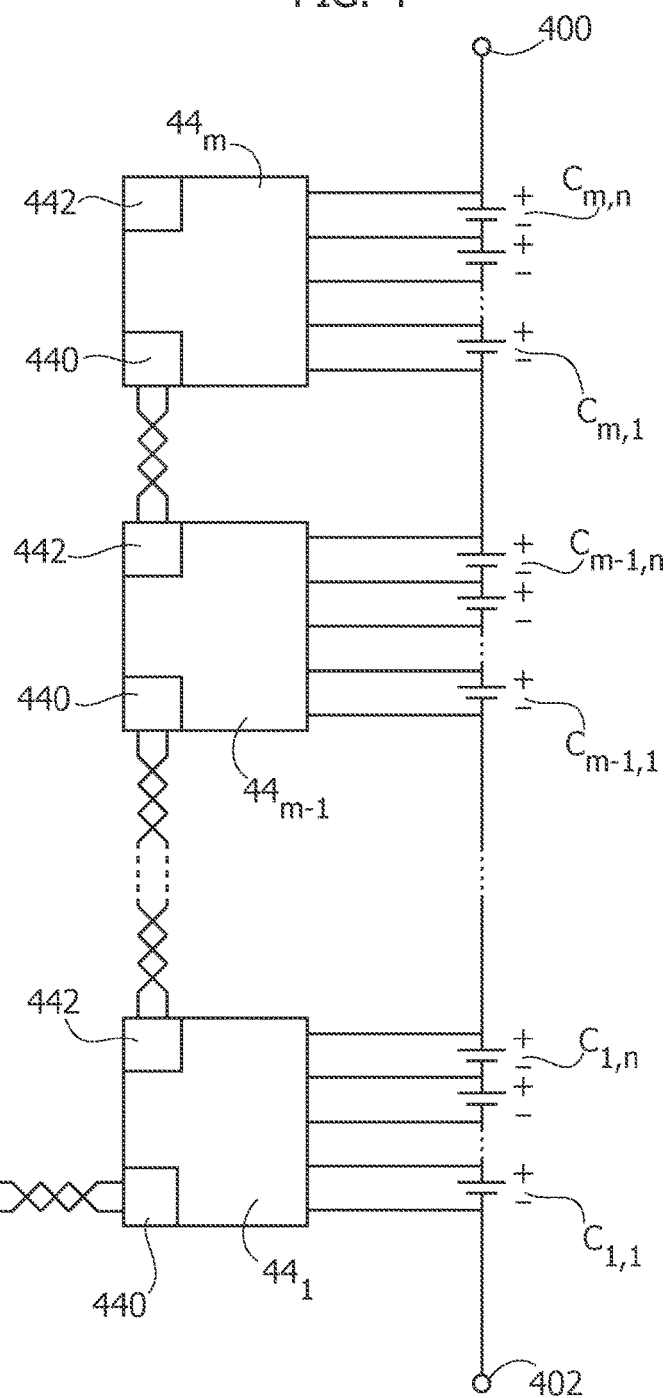
FIG. 4 shows an example of the implementation of the battery management function via additional battery management modules.
Figure 4:
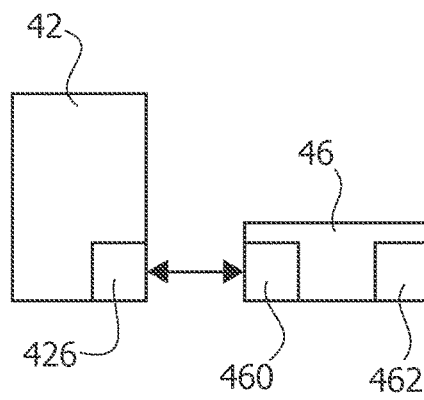
Figure 5:
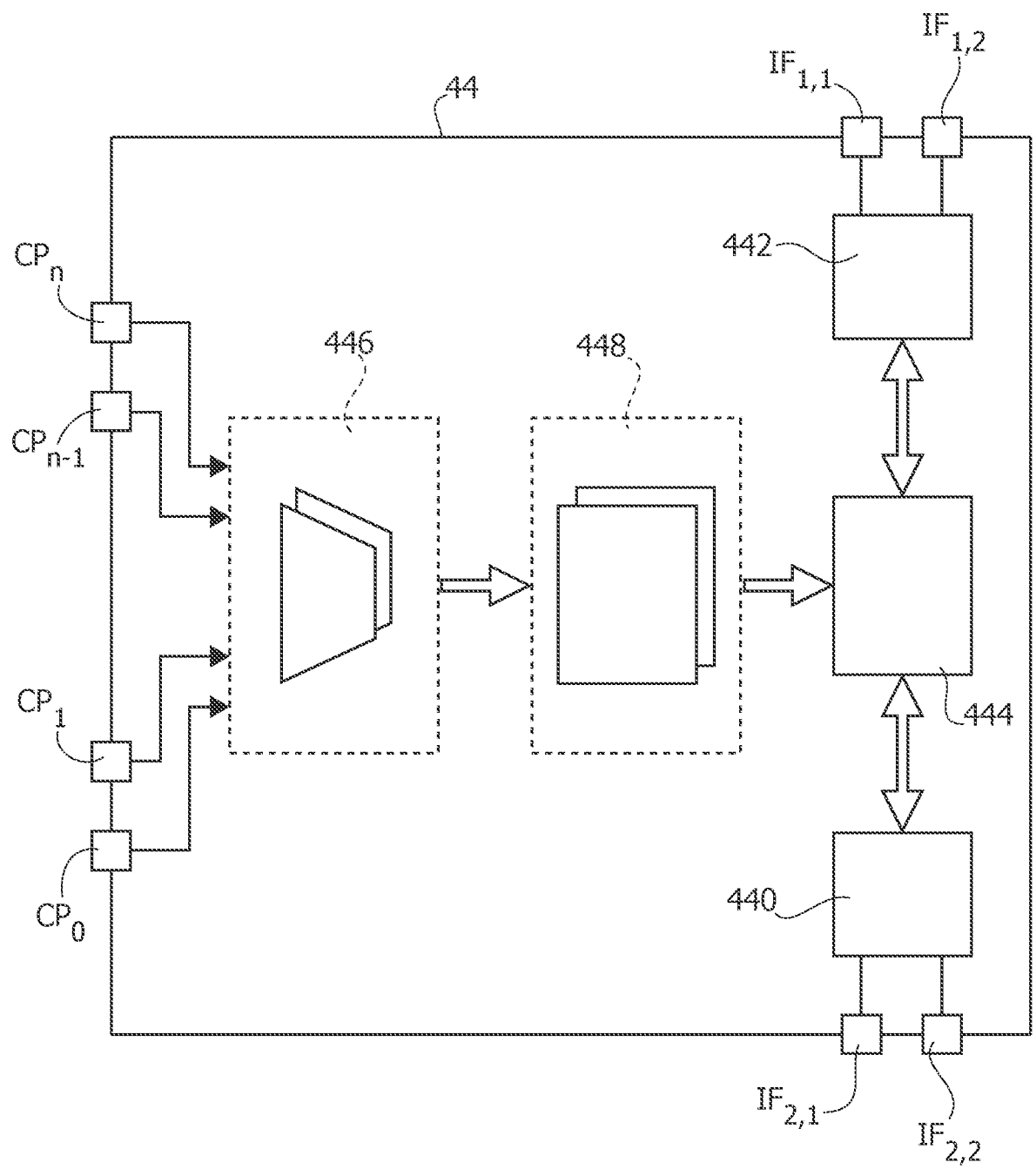
FIG. 5 shows an example of the battery management module of FIG. 4.
Figure 6:
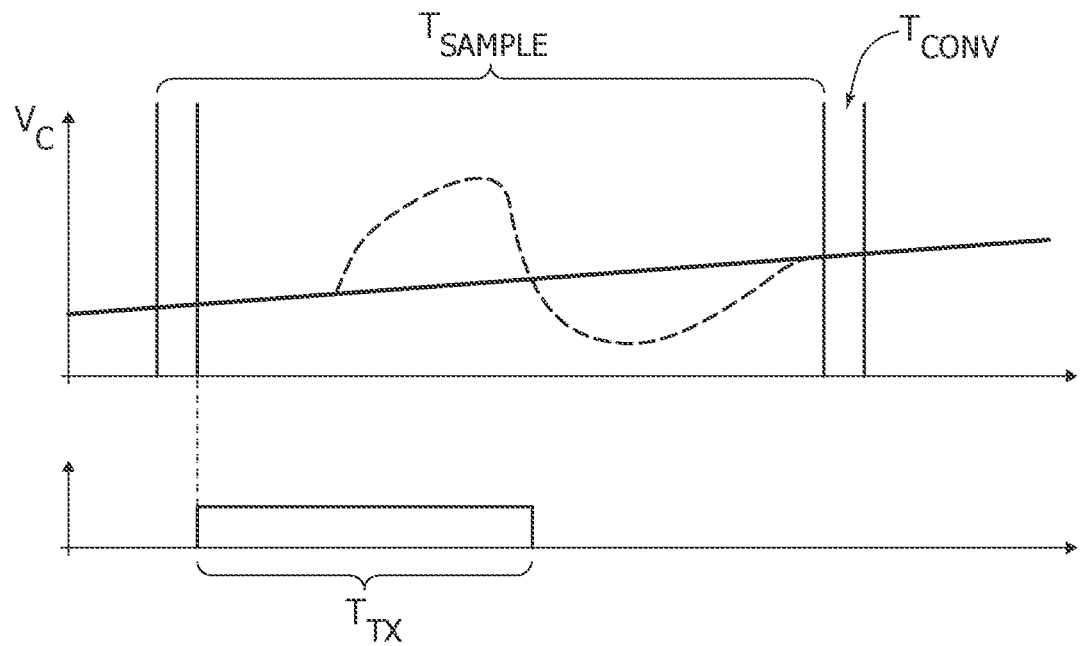
FIG. 6 show an example of the operation of a battery management module.

FIG. 6 shows the operation of a processing system 44 as shown in FIGS. 2, 4 and 5.

Specifically, in FIG. 6, the analog-to-digital converters 448 are configured to sample the voltages $V_C$ at the respective cells C, i.e., the voltages between the pins $CP_o \ldots CP_n$. In general, such analog-to-digital conversions require a time $T_{CONV}$. As mentioned before, in various embodiments, each processing system 44 comprises n analog-to-digital converters 448, because this permits to perform the conversions of the cell voltages in parallel at the same instant, and also the total conversion time $T_{CONV}$ is reduced. For example, in various embodiments, the conversion time of an ADC 448 is in a range between 100 us and 2 ms, preferably between 200 and 400 us.

Once the digital samples of the cell voltages have been acquired by the digital processing circuit 444, the digital processing circuit 444 transmits one or more data packets via the communication interface 440 to the digital processing circuit 42, e.g., by using a daisy chain as shown in FIG. 4. Accordingly, the one or more data packets usually comprises n samples, wherein each sample has a number $N_{ADC}$ of bits corresponding to the number of bits $N_{ADC}$ of the ADCs 448, such as 16 bits. Thus, at least a given number of bits ($n \times N_{ADC}$) has to be transmitted by each processing system 44.

For example, the L9963 chip supports a burst mode, wherein a sequence of n data packets is transmitted. Specifically, each data packet has 40 bits, of which only 16 bits are used to transmit the actual sample and the other bits contain additional data, such as a device ID identifying the number of one of the processing systems 44 in a daisy chain. Moreover, the transmission may also add additional error detection and/or error correction bits, such as cyclic redundancy check (CRC) bits. For example, typically the transmission time $T_{TX}$ for transmitting the values of all cells of the battery is in a range between 4 and 8 ms.

Accordingly, the transmission of the cell voltages of all processing systems requires a given time $T_{TX}$, wherein the transmission time $T_{TX}$ also depends of the number m of sets of cells.

For example, when using a daisy chain as shown in FIGS. 4 and 5, the digital processing circuit 42 may send via the communication interface 426 a command to the processing systems 44 requesting the sampling of the cell voltages, and in response to this command, each processing system 44 may sample the respective cell voltages.

In various embodiments, the processing systems 44 may automatically transmit the respective data, and/or may wait that the digital processing unit 42 sends a command containing a read request.

For example, in the latter case, the digital processing unit 42 may send a read request to each processing system 44 (e.g., by including an identification of the respective processing system 44 in the command), and the respective processing system 44 may transmit in response one or more data packets contain the sampled data. Generally, when using a daisy chain, the read request and the sampled data may be transmitted via intermediate processing systems 44, i.e., each processing system 44 may be configured to:

receive data via the communication interface 440 and retransmit the data via the communication interface 442; and receive data via the communication interface 442 and retransmit the data via the communication interface 440.

Conversely, in the former case, the processing systems 44 may automatically generate a sequence of data packets. For example in this case, the last processing system $44_m$ may transmit via the interface 440 one or more data packets comprising the respective sampled data to the previous processing system $44_{m-1}$, which thus receives the data packet via the interface 442, appends the respective sampled data and transmits the new data packets via the interface 440 to the previous processing system $44_{m-2}$, etc.

Irrespective of the specific solution used for transmitting the data packets, the total conversion time $T_{CONV}$ and the transmission time $T_{TX}$ define the minimum sampling period $T_{SAMPLE}$ between two consecutive conversions/transmissions, i.e., $T_{SAMPLE} > T_{CONV} + T_{TX}$.

Thus, in these solutions, all n×m digital samples of the cell voltages have to be transmitted to the digital processing circuit 42. During this time, the processing system 44 does not perform further analog-to-digital conversions.

However, the inventor has observed, that for high-power rechargeable batteries, such as Li-Ion traction batteries for electric vehicles, a sampling time $T_{SAMPLE}$ between several milliseconds and several tenth of milliseconds may be too high. Specifically, as shown in FIG. 6, between two consecutive analog-to-digital conversion, one or more of the cell voltages may vary in a critical range without detection. In fact, as mentioned before, the minimum sampling time mainly depends on the communication bandwidth and the data amount, which in turn depends on the number n×m of cells C. Conversely, an ADC has usually a higher performance, which would permit a better sampling rate.

Accordingly, in case a disturbance exceeds the Nyquist criteria, this disturbance may not be detected, even though the ADCs 448 could be used with a higher performance.

A rather straight forward solution to this problem would be splitting the communication channel 48 into several parallel communication channels, thereby reducing the number of data to be transmitted on each communication channel. However, this implies that also the digital processing circuit 42 would require several communication interfaces 426 and additional pins, and has to manage several parallel communications.

Figure 7:
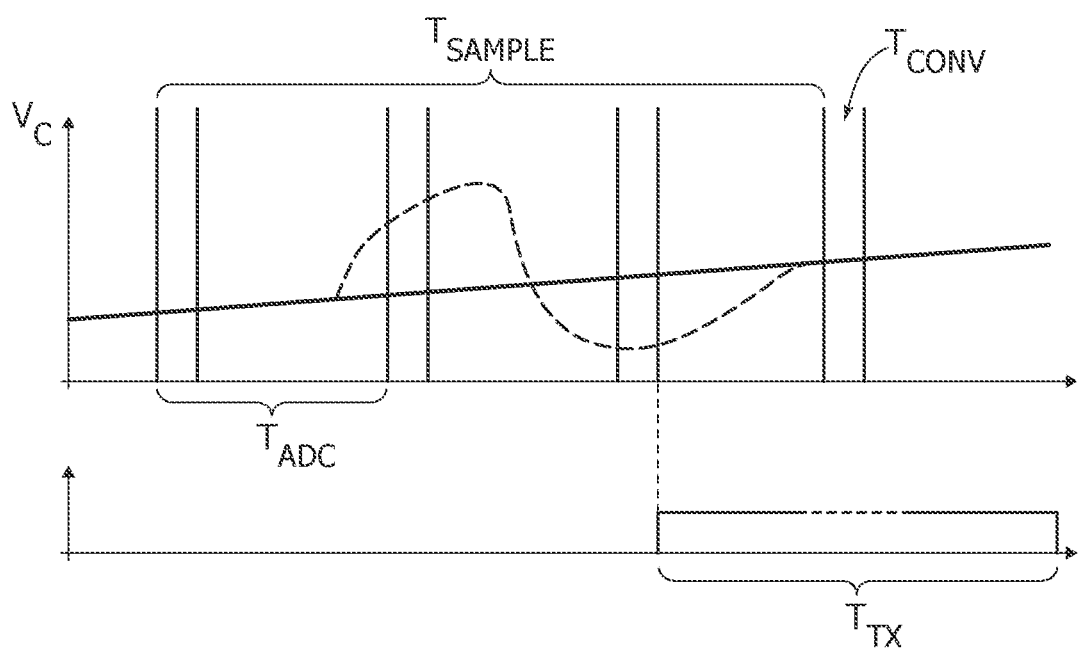
FIG. 7 shows an embodiment of the operation of a battery management module according to the present disclosure.

Conversely, FIG. 7 shows an embodiment of the operation of a processing system 44a according to the present disclosure.

Specifically, in the embodiment considered, the processing system 44a is configured to perform, for each of the n cell voltages, a plurality of k analog-to-digital conversions during a sampling period $T_{SAMPLE}$. For example, in FIG. 7, the processing system 44a performs three analog-to-digital conversion approximately at time intervals $T_{ADC}=T_{SAMPLE}/k$, with $T_{ADC}>T_{CONV}$.

Next, the processing system 44a is configured to generate one or more data packets comprising data determined by performing a lossless and/or lossy data compression of the k digital samples of the n cell voltages, and transmit the one or more data packets. Specifically, as shown in FIG. 7, in various embodiments, the transmission may occur while the next analog-to-digital conversions are performed, and the only constraint is that the transmission time $T_{TX}$ of the data packet (comprising the compressed data of a plurality digital samples) is smaller than the sampling time $T_{SAMPLE}$, or vice versa the sampling time $T_{SAMPLE}$ has to be greater than the transmission time $T_{TX}$.

Figure 8:
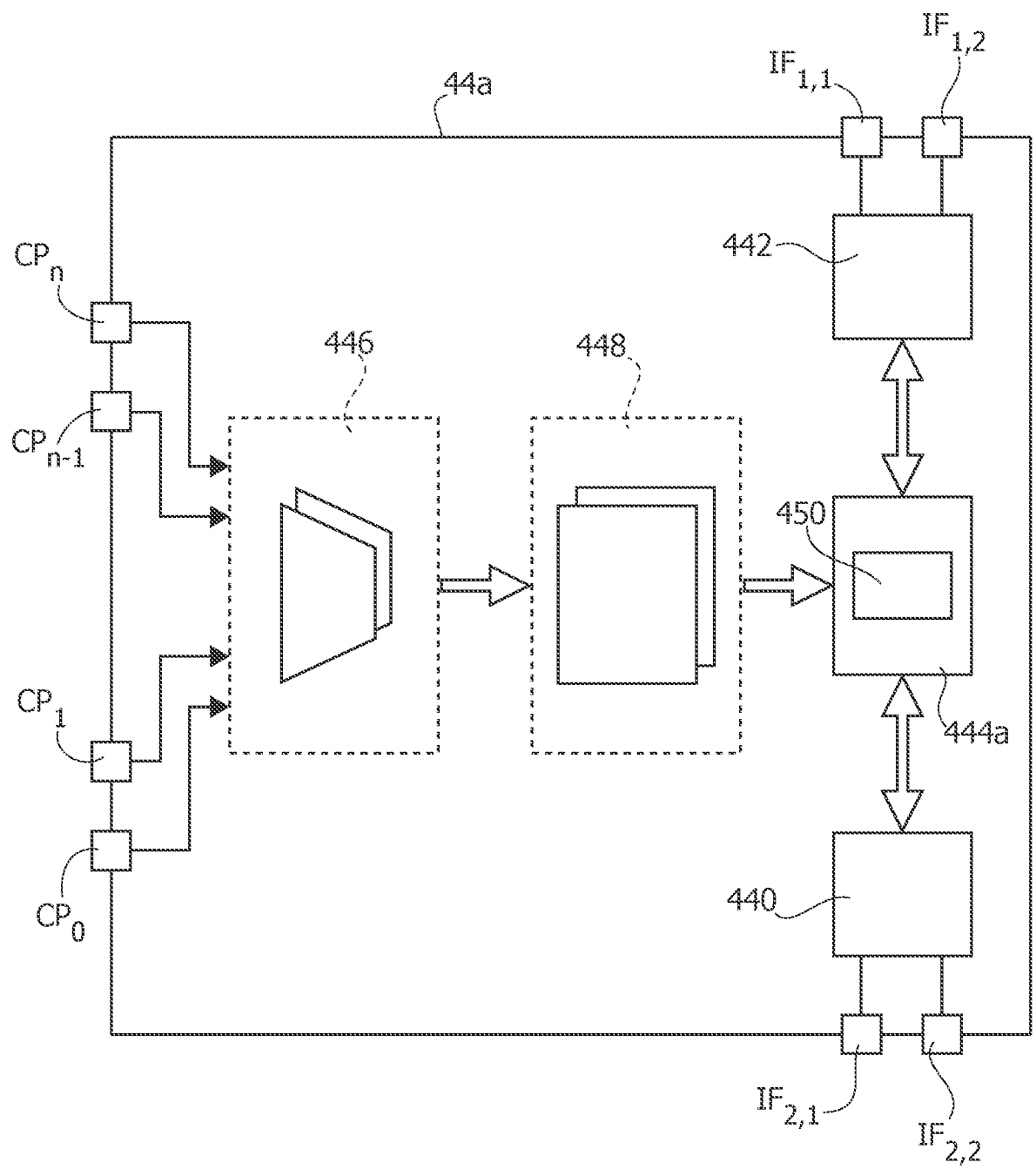
FIG. 8 is a block diagram showing an embodiment of a battery management module according to the present disclosure.

FIG. 8 shows an embodiment of the processing system 44a. Specifically, in the embodiment considered, the processing system 44a has the same basic architecture as the processing system 44 already described with respect to FIG. 5. Specifically, also in this case, the processing system 44a comprises:

a given number n+1 of pins $CP_o \ldots CP_n$ for connection to n cells $C_1 \ldots C_n$;

a plurality of (an preferably n) analog-to-digital converters 448 configured to generate digital samples of the voltages between two pins $CP_o \ldots CP_n$ connected to the same cell C, thereby generating digital samples of the voltages at the cells $C_1 \ldots C_n$ (or the filtered versions thereof);

optional multiplexers 446 for connecting the pins $CP_o \ldots CP_n$ to the analog-to-digital converters 448;

a communication interface 440 for transmitting digital data;

an optional further communication interface 442 in case the processing system 44a may be connected in cascade to form a daisy chain; and a digital processing unit 444a.

Specifically, with respect to FIG. 5, the digital processing unit 444a is configured to implement a data compression unit 450. Generally, the data compression unit 450 may be a dedicated hardware circuit and/or implemented with computer instructions executed via a programmable microprocessor 444a.

Figure 9:
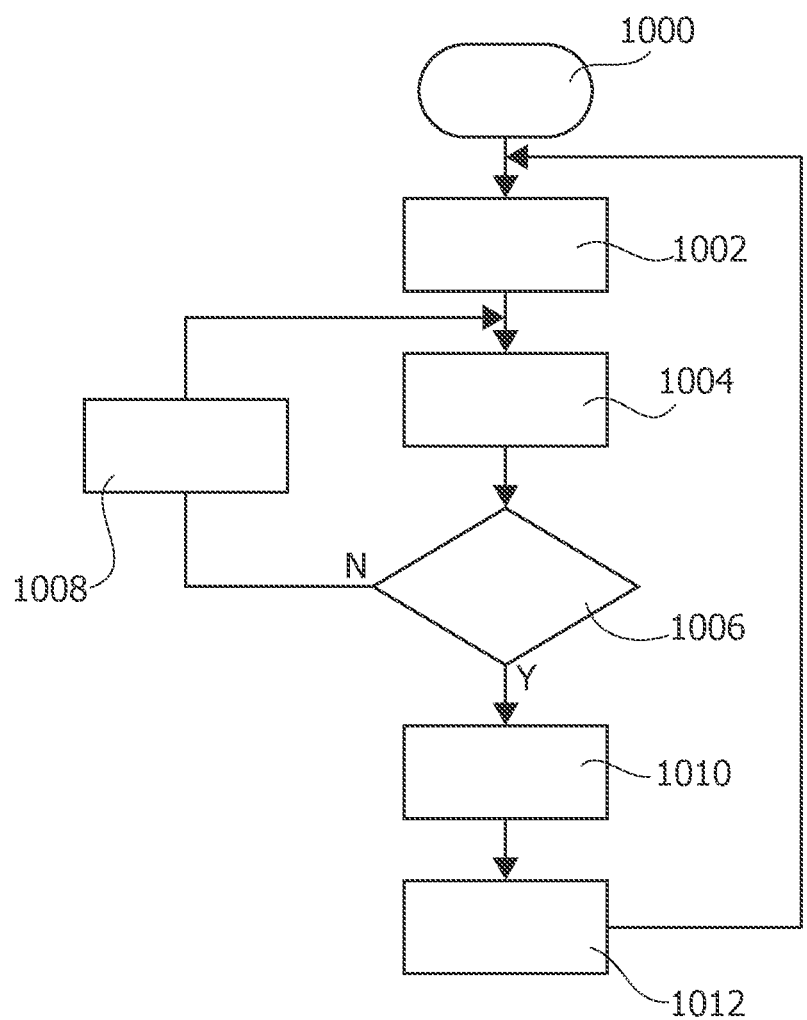
FIG. 9 is a flow-chart showing an embodiment of the operation of a battery management module according to the present disclosure.

FIG. 9 shows an embodiment of the operation of the digital processing unit 444a.

Specifically, after a start step moo, the digital processing unit 444a proceeds to a step 1002, where the digital processing unit 444a waits for the start of a new sampling interval $T_{SAMPLE}$. For example, the digital processing unit 444a may wait at the step 1002 for a trigger event, such as:

a trigger signal received from the digital processing unit 42 (possibly via other processing system 44a); or a trigger signal generated within the processing system 44a, e.g., via a timer circuit (possibly also implemented within the digital processing unit 444a), e.g., indicating that the time $T_{SAMPLE}$ has lapsed.

For example, in various embodiments, each processing system 44a comprises a respective timer circuit, which may be started (or reset) in response to a synchronization signal received from the digital processing circuit 42. In this case, the time $T_{SAMPLE}$ may also be programmable.

Generally, this step is purely optional, because the digital processing unit 444a may also start immediately a new sampling interval $T_{SAMPLE}$, and the duration of the sampling interval $T_{SAMPLE}$ may be defined by other delays, as will be described, e.g., with respect to step 1008.

Once a new sampling interval is detected at the step 1002 (or in general started), the digital processing unit 444a proceeds to a step 1004, where the digital processing unit 444a acquires the digital samples of the cell voltages via the analog-to-digital converters 448. For example, the digital processing unit 444a may start at the step 1004 an analog conversion and wait that the analog-to-digital converters 448 signal that the respective conversions have been completed. In case the number of analog-to-digital converters 448 is smaller than n, the digital processing unit 444a may also set the multiplexers 446 and start a new analog-to-digital conversion.

Accordingly, at the end of the step 1004, the digital processing unit 444a has obtained the digital samples of the cell voltages for a given sampling instant.

The digital processing unit 444a proceeds then to a verification step 1006. Substantially, the digital processing unit 444a verifies at the step 1006 whether further sampling operations should be performed for the same sampling interval. In fact, as mentioned before, in various embodiments the data packet to be transmitted is determined as a function of a plurality of k samples for each of the cell voltages, such as three samples. For example, in various embodiments the digital processing unit 444a may be configured, such that the value k is programmable. For example, for this purpose, the value k may be stored to a programmable (volatile or non-volatile) memory, and the digital processing unit 444a may be configured to receive a new value via the communication interface 440 (or 442) and overwrite the stored value k.

Specifically, in the embodiment considered, in case further samples have to be obtained (output "N" of the verification step 1006), the digital processing unit 444a proceeds to a wait step 1008, where the digital processing unit 444a waits for the next sampling instant.

For example, the digital processing unit 444a may wait at the step 1008 for a given trigger event indicating that the time $T_{ADC}$ has lapsed. Once the digital processing unit 444a detects the next sampling instant, the digital processing unit 444a proceeds again to the step 1004 for obtaining the next samples of the cell voltages. For example, in various time, each processing system 44a comprises a respective timer circuit configured to generate a trigger when the time $T_{ADC}$ has elapsed. For example, such a timer circuit may be started (or reset) at the step 1004 or 1008 (based on whether the time $T_{ADC}$ refers to the time between two consecutive start instances of A/D conversions, or the time between the end of an A/D conversion and the start of the next A/D conversion). In this case, the time $T_{ADC}$ may also be programmable.

Generally, also the wait step 1008 is purely optional, and the time $T_{ADC}$ may correspond to the conversion time $T_{CONV}$ of the A/D conversions. For example, in this case, the sampling period $T_{SAMPLE}$ may have (approximately) a time $k \cdot T_{CONV}$. For example, in various embodiments, the ADCs 448 may be configured such that the conversion time or "conversion window" $T_{CONV}$ is programmable. For example, sigma-delta ADCs operate in a way that this results in an averaging of the voltage during the window. That means the voltage curve is smoothened, but the contained information is not per se lost.

Figure 10:
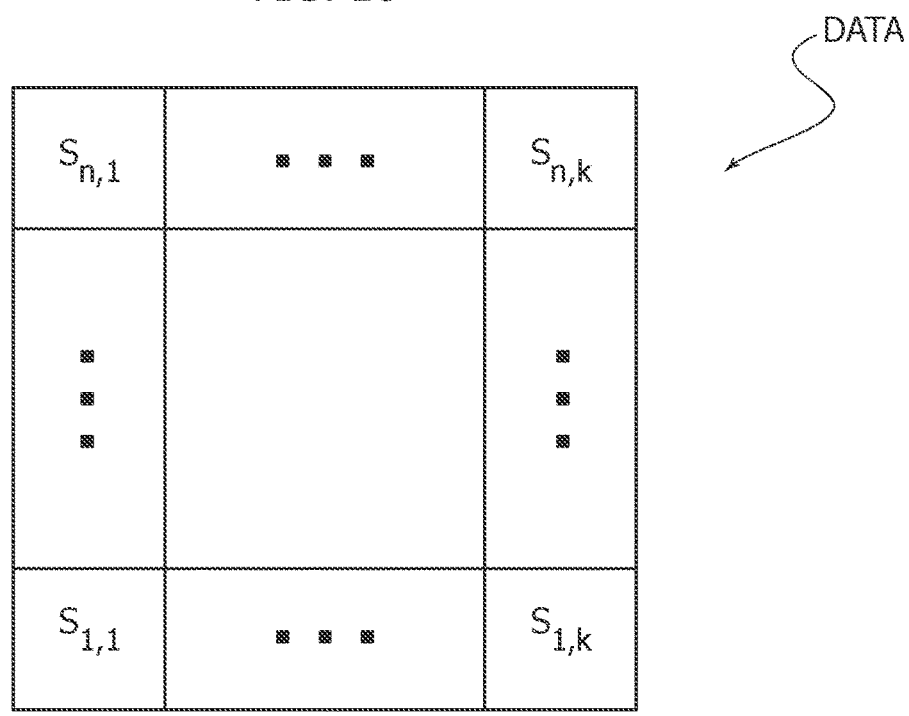
FIG. 10 shows an embodiment of the data acquired by the battery management module of the present disclosure.

Conversely, in case a given number k of samples have been obtained (output "Y" of the verification step 1006), the digital processing unit 444a proceeds to a step 1010, wherein the digital processing unit 444a generates one or more data packet via a lossless and/or lossy data compression operation. Thus, as also shown in FIG. 10, the digital processing circuit 444a is configured to acquire a data set DATA, e.g., in the form of a matrix, comprising for each cell voltage a respective set of k samples, i.e., samples $S_{1,1} \ldots S_{1,k}$ for the voltage of cell $C_1$ (connected between the pins $CP_o$ and $CP_1$) to samples $S_{n,1} \ldots S_{n,k}$ for the voltage of cell $C_n$ (connected between the pins $CP_{n-1}$ and $CP_n$), and generate the one or more data packets to be transmitted as a function of the data set DATA.

Next the digital processing unit 444a proceeds to a step 1012, where the digital processing unit 444a sets a transmission flag indicating that the one or more data packets are ready for transmission and the digital processing unit 444a returns to the step 1002 in order to wait for the start of the next sampling period TSAMPLE.

For example, in various embodiments, in response to this transmission flag, the processing system 44a may:
- automatically transmit the data packet to the digital processing circuit 42;
- wait for a transmission request from the digital processing circuit 42 and, in response to this transmission request, transmit the data packet to the digital processing circuit 42; or
- wait for one or more data packet received via the interface 442 (from another processing system 44), append the data packet to the received data packets, and transmit the new data packets via the interface 440 (to a following processing system 42, the digital processing circuit 42 or a bridge circuit 46).

For example, the first two options may also apply to the last processing system 44m of a daisy chain.

Figure 11:
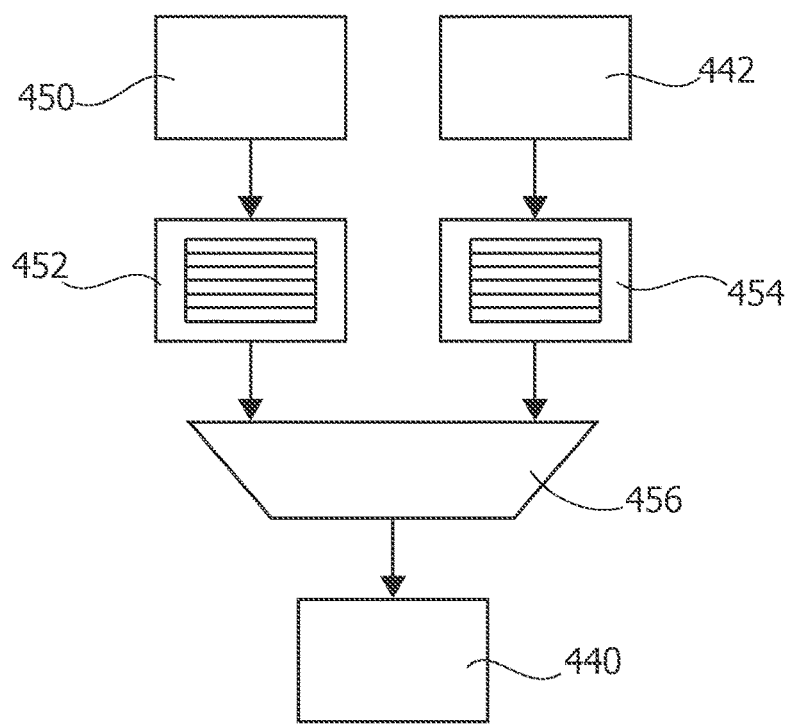
FIG. 11 shows an embodiment of the operation of the communication interfaces of the battery management module of FIG. 8.

As mentioned before, in various embodiments, the communication interface 440 (and 442) may operate in parallel to the analog-to-digital converters 448. For example, as shown in FIG. 11, for this purpose, the digital processing circuit 444a, in particular the encoder circuit 450, may store the encoded data packet(s) to a transmission queue 452, such as a FIFO memory, and the communication interface 440 may automatically read data from the transmission queue 452 and transmit the data.

Specifically, in various embodiments, the processing system 44a comprises a first queue 452, such as a first FIFO memory, wherein the encoder circuit 450 is configured to store the encoded data packet(s) (indicative of the n×k samples) to the first queue 452. Moreover, the processing system 44a comprises a second queue 454, such as a second FIFO memory, wherein the communication interface 442 is configured to store received data (i.e., data received from another processing system 44) to the second queue 452. For example, in various embodiments, the first queue 452 has a dimension being sufficient in order to store at least the compressed data (generated as a function of the n×k samples S), and preferably the complete data packets. Conversely, the second queue may also comprise only a single register.

Accordingly, by using a multiplexer 456, the communication interface 440 may transmit sequentially the data stored to the queues 452 and/or 454. For example, when the transmission flag is set and once having received data via the communication interface 442 (which may be detected because the queue 454 contains data), the communication interface 440 may:
- first transmit the data stored to the queue 454 and then transmit the data stored to the queue 452, i.e., the encoded data packet is appended to the received data; or
- first transmit the data stored to the queue 452 and then transmit the data stored to the queue 454, i.e., the received data are appended to the encoded data packet.

In various embodiments, as mentioned before, the last processing system 44m may directly transmit the data stored to the queue 452 in response to the transmission flag.

As mentioned before, in various embodiments, the transmission of the data stored to the queue 452 may also be started in response to a request received from the processing unit 42 (instead of using an automatic transmission). Accordingly, in this case, the interface 440 may be configured to always transmit the data stored to the queue 454 (bypass function) and transmit the data stored to the queue 452 only in response to a read request.

In the following will now be described possible embodiments of the operation of the data compression unit 450. In general, as described in the foregoing, the data compression unit 450 is configured to process a data set DATA comprising for each of the n cell voltages a plurality of k samples, i.e., the data compression unit 450 is configured to generate one or more data packets to be transmitted as a function of the samples $S_{1,1} \ldots S_{1,k}$ to $S_{n,1} \ldots S_{n,k}$. For example, as mentioned before, these data packets (or the processed/compressed data) may be stored to the queue 452. In order to describe the operations applied to a given sequence, reference will be made to a generic sequence of samples $S_1 \ldots S_k$, corresponding to one of the n sequences.

Figure 12:
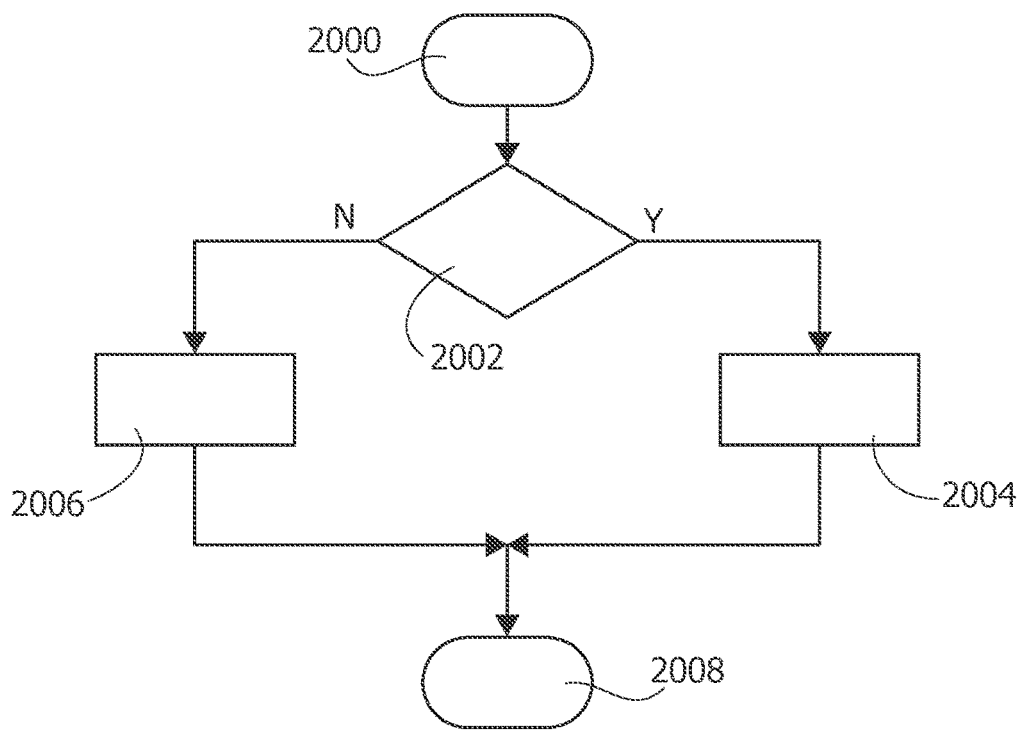
FIGS. 12 to 15 show embodiments of data compression operations adapted to be implemented within the battery management module according to the present disclosure.

FIG. 12 shows a first embodiment of the operation of data compression unit 450 (step 1010 in FIG. 9).

Specifically, after a start step 2000, the data compression unit 450 is configured to compare at a step 2002 the value of each sample S with a given upper threshold value $TH_H$ and lower threshold value $TH_L$.

Figure 13:
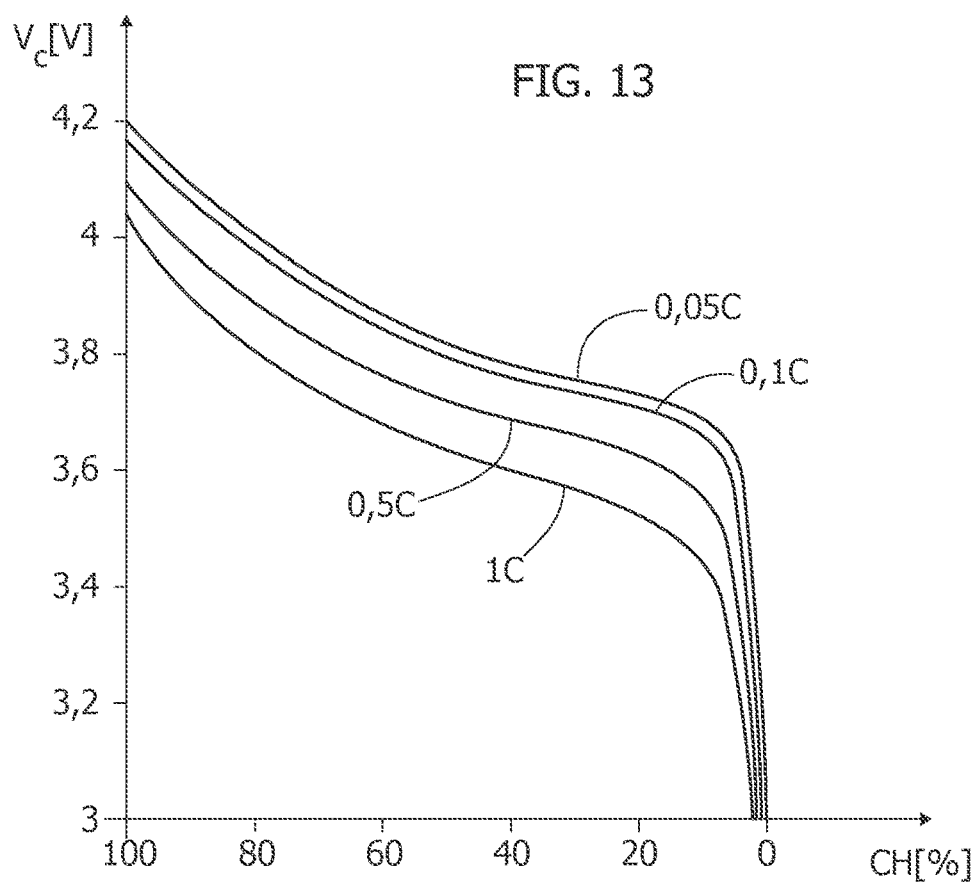

Specifically, FIG. 13 shows in this respect possible discharge curves of a Li-Ion cell C, such as a manganese oxide-based Li-Ion cell C. Specifically, FIG. 13 shows the profile of the cell voltage $V_C$ with respect to a cell charge CH in percentage for different C-rates, such as 0.05 C, 0.1 C, 0.5 C and 1 C.

As shown in FIG. 13, in normal operation, the cell voltage remains between an upper threshold value $TH_H$ and lower threshold value $TH_L$, such as between an upper threshold value $TH_H$ corresponding to the voltage 4.2V and a lower threshold value $TH_L$ corresponding to the voltage 3.0V. Generally, the specific values may vary based on the cell chemistry.

Accordingly, in case the values of all sample $S_{1,1} \ldots S_{1,k}$ to $S_{n,1} \ldots S_{n,k}$ are between the upper threshold value $TH_H$ and lower threshold value $TH_L$, the data compression unit 450 proceeds to a step 2004, where the data compression unit 450 reduces the dynamic range of the samples $S_{1,1} \ldots S_{1,k}$ to $S_{n,1} \ldots S_{n,k}$. Specifically, in various embodiments, the data compression unit 450 subtracts a given constant offset OFF from each sample S, such as the lower threshold value $TH_L$, and removes a given number of most significant bits. In various embodiments, the offset OFF is programmable, e.g., in order to permit that the same processing system 44a may be used with different cells having different voltage ranges.

For example, in a L9963, the ADCs 448 have 16 bits with a resolution of 89 uV. For example, for the above mentioned voltage range (3.0-4.2 V) and resolution (89 uV), 12 bits (i.e., 2048) would be sufficient in order transmit the values of a sample S, i.e., once having subtracted the offset OFF, the data compression unit 450 may remove the 4 most significant bits of each sample S. In fact, in order to reconstruct the original value of the sample, it is sufficient that the digital processing circuit 42 adds again the value OFF to each transmitted value. In various embodiments, the number of most significant bits to be removed is programmable.

Moreover, the inventor has observed that, while the ADCs 448 may indeed support a resolution of 89 uV, with a fast conversion speed in the range of 300 us, this resolution is usually not satisfied for the actually measured value, and indeed the two least significant bits may be rather meaningless. Accordingly, in various embodiments, the data compression unit 450 may also remove a given number of least significant bits at the step 2004. In various embodiments, the number of least significant bits to be removed is programmable. For example, the number of least significant bits which may be "useless" may depend on the (fixed or programmed) conversion time $T_{CONV}$, e.g., less least significant bits should be removed when the conversion time increases. Accordingly, in various embodiments, the conversion time $T_{CONV}$ may be programmable and the data compression unit 450 may be configured to determine the number of least significant bits to be removed as a function of the data used to program the conversion time $T_{CONV}$ of the ADCs. However, in various embodiments, the number of least significant bits to be removed may also be programmed independently.

Thus, essentially, the step 2004 reduces the number of bits of the samples S of the data structure DATA, e.g., to 10 bits, without effecting (significantly) the original precision of the sampled data. For example, in case the processed samples S have 10 bits, the data packet(s) would comprise a total of k×10 bit for each of the n cell voltage.

Conversely, in case the value of at least one of the samples $S_{1,1} \ldots S_{1,k}$ to $S_{n,1} \ldots S_{n,k}$ is greater than the upper threshold value $TH_H$ or smaller than the lower threshold value $TH_L$, the data compression unit 450 proceeds to a step 2006. Specifically, this condition usually only occurs in case of a malfunction. In general, in this case, it is not possible to transmit the samples with reduced dynamic range.

In a first embodiment, the data compression unit 450 is configured to replace the values being between the thresholds $TH_L$ and $TH_H$ with the reduced length bit sequences described with respect to the step 2004. Conversely, the data compression unit 450 may store the values exceeding the threshold values, and replace the values with default values, e.g., a bit sequence of "0" for the samples being smaller than the lower threshold and a bit sequence of "1" for the samples being greater than the upper threshold. Accordingly, the digital processing unit 42 may easily determine that given values were out of range, and possibly may request a transmission of the respective (stored) original values.

Conversely, in other embodiments, the data compression unit 450 may switch to a different data packet format. For example, such a different data packet format may be indicated by using data packets comprising also a header, which may comprise a field for storing a value indicating a data packet format. Alternatively, the data packet may start with a predetermined bit sequence usually not being possible when using the operations indicated at the step 2004, such as a bit sequence of predetermined length having all values set to "0" or "1".

For example, in this case, the data packet(s) may comprise:
only a single value (with full resolution) for each cell voltage selected amongst the k samples S of each cell voltage, such as the greatest value in case one of the samples exceeds the upper threshold value $TH_H$ or the smallest value in case one of the samples exceeds the lower threshold value $TH_L$; or
all k values (with full resolution) for each cell voltage, because in case of malfunctions, it may not be necessary to maintain the same sampling frequency.

For example, usually the transmission of a default value or of a single value is sufficient, because this condition already indicates a malfunction. In fact, the transmission of plural values for each cell voltage is usually only required in order to determine fast changes during the normal operation of the battery.

In both cases (steps 2004 and 2006) the data compression unit proceeds to a stop step 2008.

Figures 14, 15:
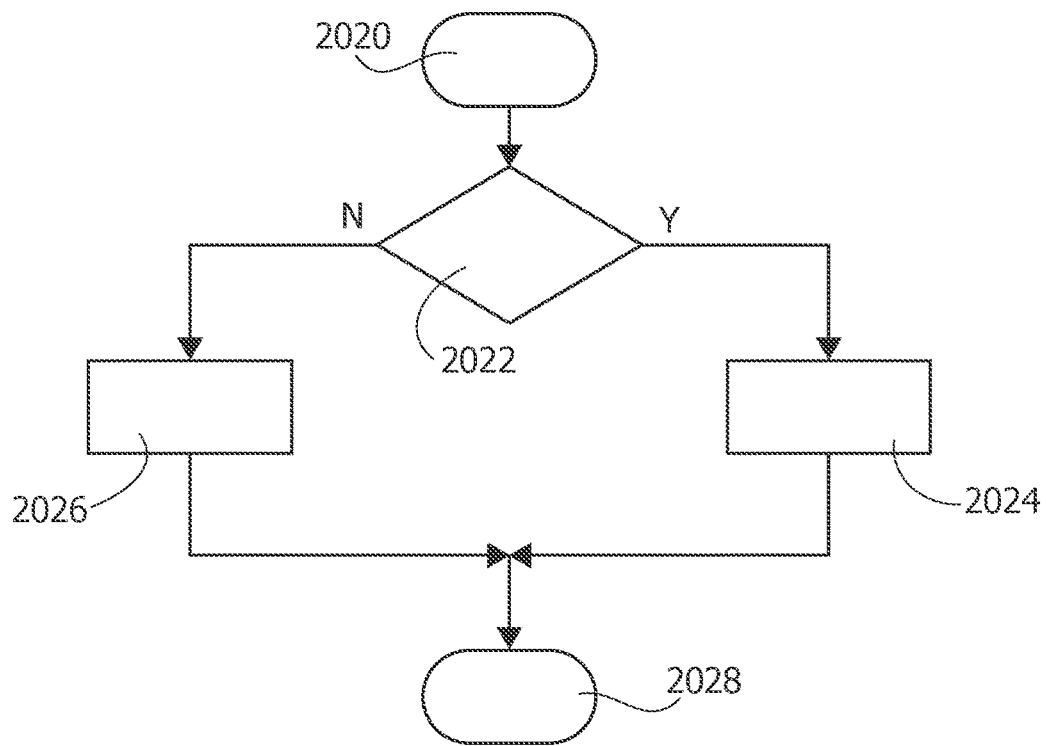

FIG. 14 shows a second embodiment, which may also be combined with the embodiment described with respect to FIGS. 12 and 13.

Specifically, the embodiment shown in FIG. 14 may be used in case a plurality of k samples $S_1 \ldots S_k$ (with full or reduced resolution) have to be transmitted for the same cell voltage, and may thus also be used after the steps 2004 and/or 2006 described in the foregoing.

Specifically, as shown in FIG. 15, in the embodiment considered, the data compression unit 450 is configured to perform a delta encoding operation. Specifically, in this case, one of the samples of each sequence $S_1 \ldots S_k$ is maintained as reference value, e.g., the first sample $S_1$ (as shown in FIG. 14) or last sample $S_k$ of each sequence $S_1 \ldots S_k$, and the other samples are used to calculate (k−1) delta values $D_1 \ldots D_{k-1}$, i.e., delta values $D_{1,1} \ldots D_{1,k-1}$ to $D_{n,1} \ldots D_{n,k-1}$ for all n cells.

Specifically, each delta value $D_i$, with i=1 ... (k−1), may be determined by calculating the difference between the value of a respective sample and the reference value, e.g., $D_i = S_{i+1} - S_1$, or each delta value $D_i$ may be determined by calculating the difference between the value of a respective sample and the value of the previous sample, e.g., $D_i = S_{i+1} - S_i$.

Thus, the delta values $D_1 \ldots D_{k-1}$ reflect the absolute variation (with respect to the reference value) or relative variation (with respect to the previous value) of the sequence of samples $S_1 \ldots S_k$.

Generally, the battery 30 may be in a charge state or discharge state, and the inventor has observed that the maximum variation of the cell voltages depends on this state. For example, the inventor has observed that in the charge state the cell voltages usually vary only in the mV range, when the samples are acquired with a period $T_{ADC}$ being smaller than 10 ms. For example, in this case, the delta values may be encoded with bit sequences having 4 to 6 bits.

Similar to the operation described with respect to FIG. 12, also the difference between two samples may exceed the possible range, e.g., −7 to 7 (for 4 bits) or 31 to 31 (for 6 bits).

Accordingly, after a start step 2020, the data compression unit 450 may verify (similar to the step 2002) whether all delta values D are between a maximum threshold value $TH_H$ or minimum threshold value $TH_L$.

For example, in case all delta values D are between the maximum value $TH_H$ and the minimum value $TH_L$ (output "Y" of the verification step 2022), the data compression unit 450 may encode at a step 2024 (similar to the step 2004) the delta value with the reduced bit resolution, e.g., by using a two-complement binary encoding.

Conversely, in case the delta value is greater than the maximum value $TH_H$ or smaller than the minimum value $TH_L$ (output "N" of the verification step 2022), the data compression unit 450 may proceed to a step 2026 (similar to the step 2006).

Generally, the step 2026 is used to signal that one or more delta values are exceeding the permitted range. For example, as mentioned with respect to step 2006, in this case, the data compression unit 450 may store the respective delta value and replace the out-of-range delta values with a default value, e.g., a bit sequence corresponding to the maximum value $TH_H$ (e.g., +7) or the minimum value $TH_L$ (e.g., −7) (similar to the step 2006). Alternatively, the data compression unit 450 may switch to a different data packet format and insert in the data packet:

only a single value (with full resolution) for each cell voltage selected amongst the samples S of each cell voltage, such as the greatest or smallest value; or all k samples (with full resolution) for each cell voltage.

Also in this case (for both step 2024 and 2026) the data compression unit 450 proceeds to a stop step 2028.

Accordingly, when combining the dynamic range solution (FIG. 12) and the delta value solution (FIG. 14), the data compression unit 450 generates a data packet comprising for each cell a first absolute value, e.g., having 10 bit, and then (k−1) delta values, e.g., having 4 bits. For example, in case k=3, it may be sufficient that 18 bits are transmitted, which is close to the 16 bits used in a conventional L9963 chip.

For example, in various embodiments, the processing system 44a may support (at least) two data packet formats having the same number of bits, such as 40 bits:

a first format, wherein only a single measured value is transmitted with full resolution ($N_{ADC}$, e.g., 16 bits) for each cell voltage (essentially corresponding to the solution currently adopted in the L9963 circuits); and a second format, wherein compressed data are transmitted.

In this case, the processing system 42 may be configured to send a command to the data processing system 44a indicating which format should be used, which could be a common format for all processing systems 44a or the processing system 42 may send a command to each processing system 44a indicating a respective format. In various embodiments, the command may also comprise data indicating which compression format should be used, e.g., dynamic range reduction and/or delta encoding, and possibly the respective parameters (offset, number or MSB and/or LSB to be removed, number of bits of the delta encoding, etc.).

Accordingly, in various embodiments, the data compression unit 450 may be configured to generate the data packets as a function of the respective configuration. As mentioned before, when one or more of the values are out of range (exceeds the dynamic range or the range of the delta coding), the data compression unit 450 may insert data identifying this fact into the data packet. For example, the data compression unit 450 may set a flag or insert given predetermined values into the data packets. For example, as mentioned before, the data packet may comprise 16 bits for transmitting the measured data. In order to insert the compressed data into these 16 bits, the data compression unit 450 may periodically insert the reference value of the delta encoding (e.g., having 10 bits after the dynamic range reduction) into a data packet (associated with a given sampling interval), and then transmit for a given number of data packets (associated with the following sampling intervals) only the delta encoded values (preferably with prior dynamic range reduction). For example, as mentioned before, when using delta encoded values (with respect to the reference value or with respect to the previous value), each value could have 4 bits. Accordingly, three samples would require 12 bits, which also permits to use the remaining (16−12)=4 bits for one or more flags indicating whether one or more of the values are out of range. For example, a respective bit of these 4 remaining bits could be associated with each of the delta encoded values.

Accordingly, in case the processing system 42 determines that one or more values are out of range, the processing system 42 could request a retransmission of the respective absolute values by using the first data packet format.

The inventor has observed that the described delta encoding scheme (possibly combined with the dynamic range compression) is particularly useful when the battery 30 is charged, because usually only a low dynamic range may be expected. Specifically, it can be assumed that during charging the cell voltage will vary in a limited range and the voltage is a function mainly of the cell capacity (which may change during life cycles and aging), cell charge-level and the current that charges the cell. However, usually no jumps of the voltage level will occur. For example, considering the previous example of ADCs with a resolution of 0.089 mV and with dynamic range reduction and delta encoding, wherein two LSBs have been removed and 4 bits are used to transmit the delta values, a delta range of 2^6*0.089 mV=5.6 mV is used (e.g., +/−2.8 mV). As mentioned before, this range may apply to the difference with respect to the reference value or only between two consecutive samples.

As mentioned before, this does not necessarily apply when the battery is discharged, e.g., when the vehicle is driving or similar other high dynamic load variations. However, the inventor has observed that in this case usually the voltages of the n cells have a similar variability. In fact, a voltage drop may not be observed only in a single cell, but a similar drop occurs also in the others of the series connection as they have all to deliver the same current (see C-rate in the discharge curve shown in FIG. 13). Thus, a greater range is required, but the variation of the cell voltages of the various cells is linked.

For example, in this case, instead of using a linear delta value, the delta values could be encoded as exponent and mantissa. For example, in this case, only a limited number of exponents would be used for all delta values. Accordingly, these exponents could be abbreviated (similar to a Huffman coding), by associating with the possible exponent value bit sequences with a reduced number of bits, and the data compression unit may insert into the data packet the encoded exponent value and the mantissa with a given number of bits. For example, considering the previous example, wherein 16 bits are used for transmitting the encoded data, the data packet could comprise 2 bits for the mantissa and 3 bits for the encoded exponent for each of the 3 samples. The reaming bits could be used for indicating whether one or more of the values are out of range. In this case, one or more additional data packets could also store data indicating the mapping between the encoded exponent values and the decoded exponent values.

Alternatively, a given cell j of the n cells of a given set could represent a reference cell, such as the first (j=1) or last cell (j=n). In this case, the data compression unit 450 may be configured to transmit the absolute values or delta values (possibly also with a prior dynamic range reduction) of the reference cell with a higher resolution. For example, the data compression unit could transmit the value $S_{j,1}$ encoded with 10 bits, and then the following delta encoded values $D_{j,1}$, to $D_{j,k-1}$ with 8 bits. Conversely, the samples of the other cells are transmitted by:

calculating for each of the other cells i an offset $O_i$ of the first sample $S_{i,1}$ of the respective cell with respect to the first sample $S_{j,1}$ for the reference cell, whereby the offset $O_i$ represents the offset of the voltage of the cell i with respect to the voltage of the cell j:

$$O_i = S_{i,1} - S_{j,1};$$

calculating the delta value $D_{i,h}$, with h=1 ... (k−1) for the other samples of the respective cell according to the following equation:

$$D_{i,h} = S_{i,h+1} - S_{j,h+1} - O_i.$$

Accordingly, once having reconstructed the samples of the reference cell j, the processing system 42 may calculate the other samples via the following equations:

$$S_{i,1} = S_{j,1} + O_i;$$

$$S_{i,h+1} = S_{j,h+1} + O_i + D_{i,h}.$$

Accordingly, in this case, the processing system 42 may periodically transmit the offset values with a higher bit number, e.g., 8 bits, but the delta values $D_{i,j}$ should again have a limited range and may be transmitted with a lower bit number, e.g., 4 bits.

Accordingly, in the embodiment considered, essentially the samples of the reference cell j represent a reference shape/curve of the behavior of the cell voltages, and the offset $O_i$ is used to determine an expected waveform for the shape of the voltage of a given cell i, and the delta value is used to provide the information of the displacement of the actual value of a given sample from the expected value. Accordingly, instead of using the samples of a predetermined cell as reference samples, also new reference samples could be calculated, e.g., by calculating a mean value of the samples at a given instant, or by dynamically selecting as reference cell the cell having the smallest values, which e.g., permits to use only positive encoded offset values, which thus permits to improve the value range.

In various embodiments, also more complex compression algorithms may be used which take into account that the variation of the voltage of a given cell is not only linked to the values of the adjacent samples of the same cell (row), but also linked to the variation of the voltage of an adjacent cell (column). For example, similar situations exit in conventional image compression algorithms, where the compression algorithm uses the fact that the value of a given pixel (essentially corresponding to one of the samples) is often linked to the values of surrounding pixels. For example, also in the present case, the amount of data may be reduced by applying a 2D discrete Fourier transform to the data DATA.

Generally, the data compression unit 450 may also support a plurality of the previously described data compression methods, i.e., the data compression unit 450 may comprise one or more circuits configured to perform one or more of the following operations:

the dynamic range reduction, which may also be used in combination with other compression methods;
the simple delta encoding with respect to a reference value of the samples of the same cell;
a complex delta encoding with respect to a reference curve comprising reference samples, e.g., of a reference cell;
a delta encoding with mantissa and encoded exponent; and
a 2D Discrete Fourier Transform.

Accordingly, in various embodiments, the processing unit 42 or the processing system 44 may determine whether the battery is in the charge or discharge state, e.g., by receiving respective information for an ECU of the vehicle, and select a first data compression format (e.g., simple delta encoding) in the charge state, and a second data compression format in the discharge state.

Accordingly, the embodiments described herein permit that the cell voltages may be supervised even while data communication is on-going. Moreover, due to the proposed data compression, the sampling may be performed with a higher frequency. For example, this permits to implement new battery models and new ways of calculating battery parameters, which do not rely on a snapshot measurement but on a time-series of multiple signals.

Of course, without prejudice to the principle of the invention, the details of construction and the embodiments may vary widely with respect to what has been described and illustrated herein purely by way of example, without thereby departing from the scope of the present invention, as defined by the ensuing claims.

What is claimed is:

1. A processing system configured to monitor a given number of cell voltages of a given number of cells of a rechargeable battery, wherein the processing system comprises:
   terminals configured to be connected to the cells in order to receive the given number of cell voltages;
   at least one analog to digital converter configured to generate digital samples of the given number of cell voltages, each digital sample having a given number of bits;
   a transmission queue;
   a digital processing circuit comprising a data compression module, wherein the digital processing circuit is configured to perform the following steps for a plurality of times:
      synchronously acquire a given number of the digital samples of each of the given number of cell voltages;
      store the acquired digital samples in a memory;
      receive a given offset via a serial communication interface;
      encode, by the data compression module using a dynamic range reduction operation, the given number of digital samples of the given number of cell voltages stored in the memory, thereby generating encoded data, the dynamic range reduction operation comprising:
         subtracting the given offset from each of the given number of digital samples of the given number of cell voltages, thereby generating values indicative of a dynamic variation of each sample with respect to the offset, and
         removing a given number of most significant bits from each of the values indicative of the dynamic variation of each sample with respect to the offset; and
      store the encoded data in the transmission queue; and
   the serial communication interface, configured to sequentially transmit the encoded data stored in the transmission queue, while the digital processing circuit acquires new digital samples.

2. The processing system according to claim 1, wherein the digital processing circuit is configured to receive the given number of most significant bits via the serial communication interface.

3. The processing system according to claim 1, wherein the data compression module is configured to generate the encoded data by:
   removing a given number of least significant bits from each of the values indicative of the dynamic variation of each sample with respect to the offset;
   wherein the digital processing circuit is configured to receive the given number of least significant bits via the serial communication interface.

4. The processing system according to claim 1, wherein the data compression module is configured to:
- determine whether each of the given number of digital samples of the given number of cell voltages is between a minimum and a maximum threshold,
- in case one or more of the digital samples is not between the minimum and the maximum threshold:
- store a value of the one or more of the digital samples not being between the minimum and the maximum threshold,
- store further data to the encoded data identifying that one or more of the digital samples are not between the minimum and the maximum threshold,
- receive via the serial communication interface a re-transmission request, and
- in response to the re-transmission request, transmit via the serial communication interface at least one of the values of the one or more of the digital samples not being between the minimum and the maximum threshold.

5. The processing system according to claim 1, wherein the data compression module is configured to support a plurality of encoding modes, wherein the data compression module is configured to generate the encoded data as a function of a selected encoding mode, and wherein the digital processing circuit is configured to receive the selected encoding mode via the serial communication interface.

6. The processing system according to claim 5, wherein the plurality of encoding modes comprise, in addition to the dynamic range reduction operation, at least one of:
- a delta encoding mode, wherein the data compression module is configured to generate delta encoded values of the digital samples with respect to one or more reference values; or
- a 2D Discrete Fourier Transform mode, wherein the data compression module is configured to apply a 2D Discrete Fourier Transform mode to the given number of digital samples of the given number of cell voltages.

7. The processing system according to claim 6, wherein the data compression module is configured to generate the delta encoded values of a given cell voltage by at least one of:
- selecting a first of the given number of digital samples of the given cell voltage as a reference value, and generating the delta encoded values by calculating a difference between each following digital sample of the given cell voltage with respect to the reference value; or
- selecting the first of the given number of digital samples of the given cell voltage as the reference value, and generating the delta encoded values by calculating a difference between the following digital samples of the given cell voltage with respect to a previous digital sample of the given cell voltage; or
- determining values of a reference curve as a function of the digital samples, and generating the delta encoded values by calculating a difference between each digital sample of the given cell voltage with respect to the values of the reference curve.

8. The processing system according to claim 6, wherein the data compression module is configured to receive data identifying a value format and generate the delta encoded values as a function of the data identifying the value format by:
- encoding the delta encoded values with a linear value encoding, or
- encoding the delta encoded values with a mantissa and an exponent.

9. The processing system according to claim 1, wherein the processing system comprises:
- a further transmission queue;
- a further serial communication interface configured to sequentially receive further data and store the further data in the further transmission queue; and
- a multiplexer configured to connect the serial communication interface to the transmission queue or the further transmission queue, whereby the serial communication interface is configured to sequentially transmit the encoded data stored in the transmission queue or the further data stored in the further transmission queue.

10. A battery monitoring system comprising:
two terminals configured to be connected to a rechargeable battery;
a plurality of processing systems, each of the plurality of processing systems configured to monitor a given number of cell voltages of a given number of cells of the rechargeable battery, wherein each of the plurality of processing systems comprises:
- further terminals configured to be connected to the cells in order to receive the given number of cell voltages;
- at least one analog to digital converter configured to generate digital samples of the given number of cell voltages, each digital sample having a given number of bits;
- a transmission queue;
- a digital processing circuit comprising a data compression module, wherein the digital processing circuit is configured to perform the following steps for a plurality of times:
  - synchronously acquire a given number of the digital samples of each of the given number of cell voltages;
  - store the acquired digital samples in a memory;
  - receive a given offset via a serial communication interface;
  - encode, by the data compression module using a dynamic range reduction operation, the given number of digital samples of the given number of cell voltages stored in the memory, thereby generating encoded data, the dynamic range reduction operation comprising:
    - subtracting the given offset from each of the given number of digital samples of the given number of cell voltages, thereby generating values indicative of a dynamic variation of each sample with respect to the offset, and
    - removing a given number of most significant bits from each of the values indicative of the dynamic variation of each sample with respect to the offset; and
  - store the encoded data in the transmission queue; and
the serial communication interface, configured to sequentially transmit the encoded data stored in the transmission queue, while the digital processing circuit acquires new digital samples; and
a further processing system configured to receive the encoded data from the plurality of processing systems.

11. The battery monitoring system according to claim 10, wherein the digital processing circuit is configured to receive the given number of most significant bits via the serial communication interface.

12. The battery monitoring system according to claim 10, wherein the data compression module is configured to generate the encoded data by:
- removing a given number of least significant bits from each of the values indicative of the dynamic variation of each sample with respect to the offset;
- wherein the digital processing circuit is configured to receive the given number of least significant bits via the serial communication interface.

13. The battery monitoring system according to claim 10, wherein the data compression module is configured to:
- determine whether each of the given number of digital samples of the given number of cell voltages is between a minimum and a maximum threshold,
- in case one or more of the digital samples is not between the minimum and the maximum threshold:
- store a value of the one or more of the digital samples not being between the minimum and the maximum threshold,
- store further data to the encoded data identifying that one or more of the digital samples are not between the minimum and the maximum threshold,
- receive via the serial communication interface a re-transmission request, and
- in response to the re-transmission request, transmit via the serial communication interface at least one of the values of the one or more of the digital samples not being between the minimum and the maximum threshold.

14. The battery monitoring system according to claim 10, wherein the data compression module is configured to support a plurality of encoding modes, wherein the data compression module is configured to generate the encoded data as a function of a selected encoding mode, and wherein the digital processing circuit is configured to receive the selected encoding mode via the serial communication interface.

15. The battery monitoring system according to claim 14, wherein the plurality of encoding modes comprise, in addition to the dynamic range reduction operation, at least one of:
- a delta encoding mode, wherein the data compression module is configured to generate delta encoded values of the digital samples with respect to one or more reference values; or
- a 2D Discrete Fourier Transform mode, wherein the data compression module is configured to apply a 2D Discrete Fourier Transform mode to the given number of digital samples of the given number of cell voltages.

16. The battery monitoring system according to claim 15, wherein the data compression module is configured to generate the delta encoded values of a given cell voltage by at least one of:
- selecting a first of the given number of digital samples of the given cell voltage as a reference value, and generating the delta encoded values by calculating a difference between each following digital sample of the given cell voltage with respect to the reference value; or
- selecting the first of the given number of digital samples of the given cell voltage as the reference value, and generating the delta encoded values by calculating a difference between the following digital samples of the given cell voltage with respect to a previous digital sample of the given cell voltage; or
- determining values of a reference curve as a function of the digital samples, and generating the delta encoded values by calculating a difference between each digital sample of the given cell voltage with respect to the values of the reference curve.

17. The battery monitoring system according to claim 15, wherein the data compression module is configured to receive data identifying a value format and generate the delta encoded values as a function of the data identifying the value format by:
- encoding the delta encoded values with a linear value encoding, or
- encoding the delta encoded values with a mantissa and an exponent.

18. The battery monitoring system according to claim 10, wherein each of the plurality of processing systems comprises:
- a further transmission queue;
- a further serial communication interface configured to sequentially receive further data and store the further data in the further transmission queue; and
- a multiplexer configured to connect the serial communication interface to the transmission queue or the further transmission queue, whereby the serial communication interface is configured to sequentially transmit the encoded data stored in the transmission queue or the further data stored in the further transmission queue.

19. An electric vehicle comprising:
- a rechargeable battery; and
- a battery monitoring system comprising:
  - two terminals connected to the rechargeable battery;
  - a plurality of processing systems, each of the plurality of processing systems configured to monitor a given number of cell voltages of a given number of cells of the rechargeable battery, wherein each of the plurality of processing systems comprises:
    - further terminals configured to be connected to the cells in order to receive the given number of cell voltages;
    - at least one analog to digital converter configured to generate digital samples of the given number of cell voltages, each digital sample having a given number of bits;
    - a transmission queue;
    - a digital processing circuit comprising a data compression module, wherein the digital processing circuit is configured to perform the following steps for a plurality of times:
      - synchronously acquire a given number of the digital samples of each of the given number of cell voltages;
      - store the acquired digital samples in a memory;
      - receive a given offset via a serial communication interface;
      - encode, by the data compression module using a dynamic range reduction operation, the given number of digital samples of the given number of cell voltages stored in the memory, thereby generating encoded data, the dynamic range reduction operation comprising:
        - subtracting the given offset from each of the given number of digital samples of the given number of cell voltages, thereby generating values indicative of a dynamic variation of each sample with respect to the offset, and
        - removing a given number of most significant bits from each of the values indicative of the dynamic variation of each sample with respect to the offset; and store the encoded data in the transmission queue; and the serial communication interface, configured to sequentially transmit the encoded data stored in the transmission queue, while the digital processing circuit acquires new digital samples; and a further processing system configured to receive the encoded data from the plurality of processing systems.

20. The electric vehicle according to claim 19, wherein the digital processing circuit is configured to receive the given number of most significant bits via the serial communication interface.

21. The electric vehicle according to claim 19, wherein the data compression module is configured to generate the encoded data by:

removing a given number of least significant bits from each of the values indicative of the dynamic variation of each sample with respect to the offset;

wherein the digital processing circuit is configured to receive the given number of least significant bits via the serial communication interface.

22. The electric vehicle according to claim 19, wherein the data compression module is configured to:

determine whether each of the given number of digital samples of the given number of cell voltages is between a minimum and a maximum threshold, in case one or more of the digital samples is not between the minimum and the maximum threshold:

store a value of the one or more of the digital samples not being between the minimum and the maximum threshold, store further data to the encoded data identifying that one or more of the digital samples are not between the minimum and the maximum threshold, receive via the serial communication interface a re-transmission request, and in response to the re-transmission request, transmit via the serial communication interface at least one of the values of the one or more of the digital samples not being between the minimum and the maximum threshold.

23. The electric vehicle according to claim 19, wherein the data compression module is configured to support a plurality of encoding modes, wherein the data compression module is configured to generate the encoded data as a function of a selected encoding mode, and wherein the digital processing circuit is configured to receive the selected encoding mode via the serial communication interface.

* * * * *